United States Patent
Gui et al.

(10) Patent No.: US 7,064,807 B2
(45) Date of Patent: Jun. 20, 2006

(54) LITHOGRAPHIC APPARATUS

(75) Inventors: Cheng-Qun Gui, Best (NL); Henricus Wilhelmus Maria Van Buel, Eindhoven (NL); Maurits Van Der Schaar, Veldhoven (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/840,360

(22) Filed: May 7, 2004

(65) Prior Publication Data

US 2004/0201833 A1    Oct. 14, 2004

Related U.S. Application Data

(63) Continuation of application No. 10/043,271, filed on Jan. 14, 2002, now Pat. No. 6,768,539.

(30) Foreign Application Priority Data

Jan. 15, 2001  (EP) .................................. 01300302

(51) Int. Cl.
*G03B 27/54* (2006.01)
*G03B 27/42* (2006.01)
*G03B 27/32* (2006.01)
*G01B 11/00* (2006.01)

(52) U.S. Cl. ........................... 355/67; 355/53; 355/77; 356/401

(58) Field of Classification Search ................. 355/67, 355/53, 72, 75; 356/399, 400, 401; 438/401
See application file for complete search history.

(56) References Cited

U.S. PATENT DOCUMENTS

| | | | |
|---|---|---|---|
| 3,752,589 A | 8/1973 | Kobayashi | |
| 4,046,985 A | 9/1977 | Gates | |
| 4,408,875 A | 10/1983 | Majima | |
| 4,492,459 A | 1/1985 | Omata | |
| 4,650,983 A | 3/1987 | Suwa | |
| 4,798,470 A | 1/1989 | Moriyama et al. | |
| 4,853,745 A | 8/1989 | Kamiya et al. | |
| 4,897,553 A | 1/1990 | Nishi | |
| 4,952,060 A | 8/1990 | Ina et al. | |
| 5,241,188 A | 8/1993 | Mizutani | |
| 5,298,988 A | 3/1994 | Everett et al. | |
| 5,361,132 A | 11/1994 | Farn | |
| 5,400,145 A * | 3/1995 | Suita et al. | 356/401 |

(Continued)

FOREIGN PATENT DOCUMENTS

EP        0 756 207 A3    1/1997

(Continued)

OTHER PUBLICATIONS

Dennis Coulon, "Application Specific Lithography for MEMS," PowerPoint Presentation, Ultratech Stepper, Jan. 31, 2003, 19 pages.

(Continued)

*Primary Examiner*—Peter B. Kim
(74) *Attorney, Agent, or Firm*—Pillsbury Winthrop Shaw Pittman, LLP (57) ABSTRACT

A lithographic projection apparatus is provided with an optical system built into the wafer table for producing an image of a wafer mark that is provided on the back side of the wafer. The image is located at the plane of the front side of the wafer and can be viewed by an alignment system from the front side of the wafer. Simultaneous alignment between marks on the back and front of the wafer and a mask can be performed using a pre-existing alignment system.

42 Claims, 5 Drawing Sheets

U.S. PATENT DOCUMENTS

| | | |
|---|---|---|
| 5,483,348 A | 1/1996 | Komatsu et al. |
| 5,530,552 A | 6/1996 | Mermagen et al. |
| 5,552,892 A | 9/1996 | Nagayama |
| 5,621,813 A | 4/1997 | Brown et al. |
| 5,721,605 A | 2/1998 | Mizutani |
| 5,777,747 A | 7/1998 | Tanaka |
| 5,821,549 A | 10/1998 | Talbot et al. |
| 5,843,831 A | 12/1998 | Chung et al. |
| 5,874,190 A | 2/1999 | Tanaka |
| 5,894,530 A | 4/1999 | Wilt |
| 5,923,990 A | 7/1999 | Miura |
| 5,929,973 A | 7/1999 | Kakizaki et al. |
| 5,929,997 A * | 7/1999 | Lin ............................ 356/401 |
| 5,936,711 A | 8/1999 | Miyai et al. |
| 5,978,069 A | 11/1999 | Kato |
| 5,985,764 A | 11/1999 | Lin et al. |
| 6,141,108 A | 10/2000 | Kida et al. |
| 6,262,793 B1 | 7/2001 | Sasaya et al. |
| 6,376,329 B1 | 4/2002 | Sogard et al. |
| 6,401,008 B1 | 6/2002 | Ehrichs et al. |
| 6,417,068 B1 | 7/2002 | Bruce et al. |
| 6,441,504 B1 | 8/2002 | Glenn et al. |
| 6,525,805 B1 | 2/2003 | Heinle |
| 6,555,441 B1 | 4/2003 | Ouellet |
| 6,566,146 B1 | 5/2003 | Pang |
| 2001/0032987 A1 | 10/2001 | Narui et al. |
| 2001/0054723 A1 | 12/2001 | Narui et al. |
| 2003/0168429 A1 | 9/2003 | Lai et al. |

FOREIGN PATENT DOCUMENTS

| | | |
|---|---|---|
| JP | 51-093849 | 8/1976 |
| JP | 53143171 A | 12/1978 |
| JP | 60141235 | 7/1985 |
| JP | 62160722 | 7/1987 |
| JP | 62160723 | 7/1987 |
| JP | 62160772 | 7/1987 |
| JP | 62254423 A | 11/1987 |
| JP | 1-164032 | 6/1989 |
| JP | 01185922 | 7/1989 |
| JP | 01-264975 | 10/1989 |
| JP | 3-246923 | 11/1991 |
| JP | 05021317 | 1/1993 |
| JP | 05062871 A | 3/1993 |
| JP | 05114543 A | 5/1993 |
| JP | 08083753 A | 3/1996 |
| JP | 08111372 A | 4/1996 |
| JP | 09139342 A | 5/1997 |
| JP | 09312248 | 12/1997 |
| JP | 10-187937 | 7/1998 |
| JP | 10-209030 | 8/1998 |
| JP | 11-340120 | 12/1999 |
| JP | 2000299276 A | 10/2000 |
| JP | 2002184665 A | 6/2002 |
| JP | 2002237588 | 8/2002 |
| JP | 2002280287 A | 9/2002 |
| JP | 2003-279318 | 10/2003 |

OTHER PUBLICATIONS

Ultratech Inc.: Key Developments, Fifty Collected Press Releases for Ultratech, Inc. dated from Jul. 11, 2000 through Jun. 13, 2005, located at: http://news.moneycentral.msn.com/ticker/sigdev.asp?Symbol=US:UTEK, pp. 1-8.

Everett et al., "Aligning lithography on opposite surfaces of a substrate," *Applied Optics*, vol. 31, No. 34, pp. 7292-7294, 1992.

Katagiri et al., "Novel Alignment Technique for 0.1-μm Lithography Using the Wafer Rear Surface and Canceling Tilt Effect," *Optical Engineering*, vol. 32, No. 10, pp. 2344-2349, 1993.

Patent Abstracts of Japan, JP11340120, published Dec. 1999.

Patent Abstracts of Japan, JP05144702, published Jun. 1993.
Patent Abstracts of Japan, JP3246923, published Nov. 1991.
Patent Abstracts of Japan, JP1164032, published Jun. 1989.

\* cited by examiner

LITHOGRAPHIC APPARATUS

CROSS REFERENCE TO RELATED APPLICATIONS

This application is a Continuation of U.S. patent application Ser. No. 10/043,271 filed Jan. 14, 2002, now U.S. Pat. No. 6,768,539, which claims priority to EP01300302.5, filed Jan. 15, 2001, the contents of which are incorporated herein by reference.

BACKGROUND OF THE INVENTION

1. Field of the Invention

The present invention relates generally to lithographic projection apparatus and more particularly to lithographic projection apparatus including an optical alignment system.

2. Description of the Related Art

In general, lithographic apparatus as described herein include a radiation system for supplying a projection beam of radiation, a support structure for supporting patterning structure, the patterning structure serving to pattern the projection beam according to a desired pattern, a substrate table for holding a substrate, a projection system for imaging the patterned beam onto a target portion on a first side of the substrate, while the second side of the substrate faces the substrate table, and an alignment system for aligning a pattern of the patterning structure with an alignment mark provided on the substrate, using alignment radiation.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference.

As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and U.S. Ser. No. 09/180,011, filed 27 Feb. 1998 (WO 98/40791), incorporated herein by reference.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (comprising one or more dies) on a substrate (silicon wafer) that has been coated with a layer of photosensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Alignment is the process of positioning the image of a specific point on the mask to a specific point on the wafer that is to be exposed. Typically one or more alignment marks, such as a small pattern, are provided on each of the substrate and the mask. A device may consist of many layers that are built up by successive exposures with intermediate processing steps. Before each exposure, alignment is performed to minimize any positional error between the new exposure and the previous ones, such error being termed overlay error.

However, some of the intermediate processing steps, such as chemical mechanical polishing (CMP), rapid thermal annealing, thick layer deposition and deep trench etching, can damage or distort the alignment marks on the substrate or bury them under opaque layers. This can cause overlay errors.

In some technologies, such as micro systems technology (MST) and micro electro-mechanical systems (MEMS), devices are fabricated from both sides of a substrate. There has been a problem with performing exposures on one side of a substrate such that they are accurately aligned with features previously exposed on the other side of the substrate. An alignment accuracy of the order of 0.5 microns or better is typically required.

SUMMARY OF THE INVENTION

One aspect of embodiments of the present invention alleviates, at least partially, the above problems.

One embodiment of the present invention includes a lithography apparatus as specified in the opening paragraph, characterized by further comprising an optical system for providing an image of said alignment mark for use by the alignment system, said optical system being constructed and arranged to direct the alignment radiation via the second side of the substrate.

The image of the alignment mark may be provided at the plane of the first side of the substrate. This enables a common alignment system to be used for alignment of marks on both sides of the substrate. The alignment system may be capable of performing an alignment between features on the front and back of a substrate such that the accuracy of an exposure on one side with respect to features on the other side is of the order of 0.5 microns or better.

According to a further aspect of embodiments of the invention there is provided a device manufacturing method comprising the steps of:

providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target area of the layer of radiation-sensitive material on a first side of said substrate, while the second side of said substrate faces a supporting substrate table;

using an alignment system to align a pattern of the patterning structure with an alignment mark provided on the substrate, characterized by the steps of:

using an optical system to provide an image of said alignment mark for use by the alignment system, whereby said optical system directs the alignment radiation via the second side of the substrate;

aligning said image of said alignment mark with said pattern of said patterning structure.

Throughout this specification, reference to an alignment mark being on a particular side of the substrate of course includes the alignment mark being etched into that side of the substrate, and includes the alignment mark having subsequent material deposited on top of it such that it is embedded and is no longer necessarily exposed at the surface.

Although specific reference may be made in this text to the use of the apparatus according to the invention in the manufacture of ICs or MEMs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as being replaced by the more general terms "substrate" and "target area", respectively.

In the present document, the terms radiation and beam are used to encompass all types of electromagnetic radiation, including ultraviolet radiation (e.g. with a wavelength of 365, 248, 193, 157 or 126 nm) and EUV.

BRIEF DESCRIPTION OF THE DRAWINGS

Embodiments of the invention will now be described, by way of example only, with reference to the accompanying schematic drawings in which.

DETAILED DESCRIPTION OF EMBODIMENTS OF THE INVENTION

Embodiment 1

Figure 1:
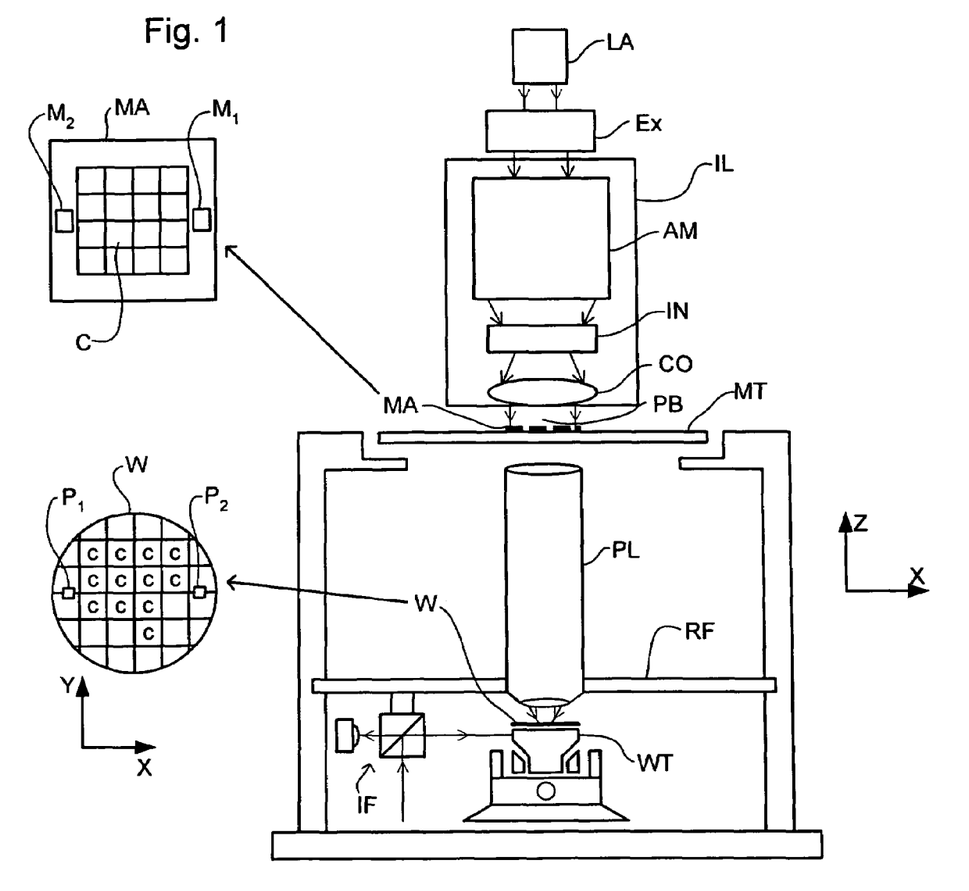
FIG. 1 depicts a lithographic projection apparatus according to an embodiment of the invention.

FIG. 1 schematically depicts a lithographic projection apparatus according to a particular embodiment of the invention. The apparatus comprises:

- a radiation system LA, Ex, IL, for supplying a projection beam PB of radiation (e.g. UV radiation);
- a first object table (mask table) MT for holding a mask MA (e.g. a reticle), and connected to first positioning means for accurately positioning the mask with respect to item PL;
- a second object table (substrate table) WT for holding a substrate W (e.g. a resist-coated silicon wafer), and connected to second positioning means for accurately positioning the substrate with respect to item PL;
- a projection system ("lens") PL (e.g. a quartz lens system, catadioptric or mirror system) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type (with a reflective mask), for example. Alternatively, the apparatus may employ another kind of patterning structure, such as a programmable mirror array of a type as referred to above.

The radiation system comprises a source LA (e.g. a UV laser or a plasma source) that produces a beam of radiation. This beam is fed into an illumination system (illuminator) IL, either directly or after being passed through conditioning means, such as a beam expander Ex, for example. The illuminator IL comprises adjusting means AM for setting the outer and/or inner radial extent (commonly referred to as □-outer and □-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (coarse positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
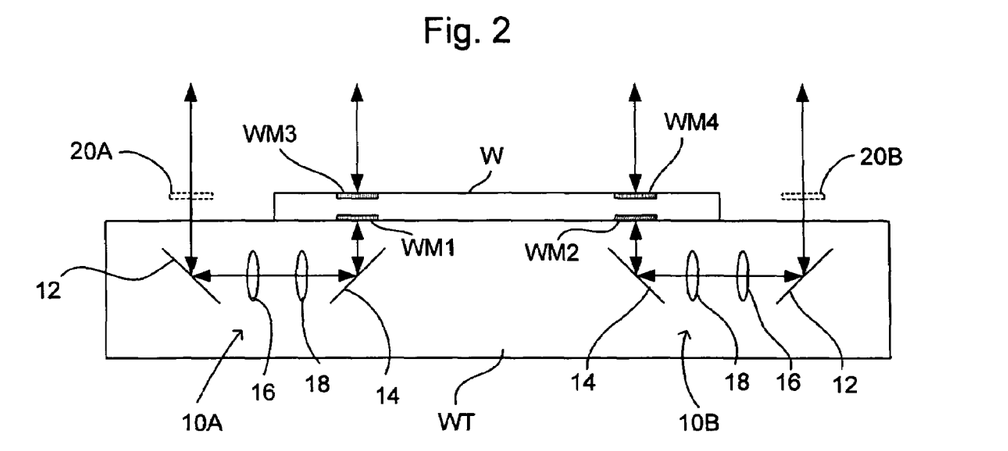
FIG. 2 is a schematic cross section illustrating the substrate table incorporating two branches of an optical system for double side alignment according to an embodiment of the invention.

FIG. 2 shows a wafer W on a wafer table WT. Wafer marks WM3 and WM4 are provided on a first side ("front side") of the wafer W and light can be reflected from these marks, as indicated by the arrows above WM3 and WM4, and used for alignment with marks on a mask in conjunction with an alignment system (not shown) which will be described later. Further wafer marks WM1 and WM2 are provided on the second side ("back side") of the wafer W. An optical system is built into the wafer table WT for providing optical access to the wafer marks WM1, WM2 on the back side of the wafer W. The optical system comprises a pair of arms 10A, 10B. Each arm consists of two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror.

In use, light is directed from above the wafer table WT onto mirror 12, through lenses 16 and 18, onto mirror 14 and then onto the respective wafer mark WM1, WM2. Light is reflected off portions of the wafer mark and returns along the arm of the optical system via mirror 14, lenses 18 and 16 and mirror 12. The mirrors 12, 14 and lenses 16, 18 are arranged such that an image 20A, 20B of the wafer mark WM1, WM2 is formed at the plane of the front (top) surface of the wafer W, corresponding to the vertical position of any wafer marks WM3, WM4 provided on the front side of the wafer W. The order of the lenses 16, 18 and the mirrors 12, 14 can, of course be different, as appropriate to the optical system. For example, lens 18 could be between the mirror 14 and the wafer W (see illustrations of later embodiments).

An image 20A, 20B of a wafer mark WM1, WM2 acts as a virtual wafer mark and can be used for alignment by the pre-existing alignment system (not shown) in exactly the same way as a real wafer mark provided on the front (top) side of the wafer W.

Figure 3:
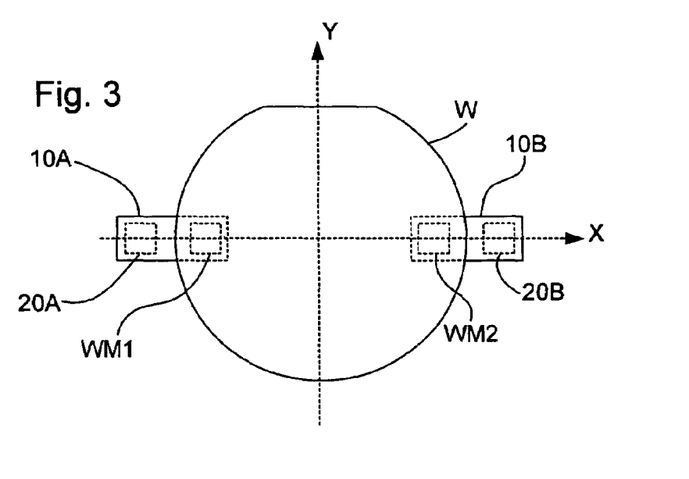
FIG. 3 is a plan view of a wafer showing the position and orientation of the double side alignment optics according to an embodiment of the invention.
Figure 4:
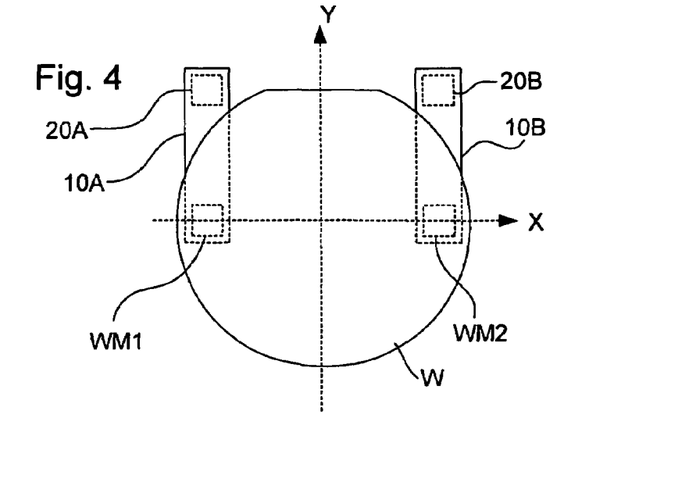
FIG. 4 is plan view showing an alternative position and orientation of the double side alignment optics according to the invention.

As shown in FIG. 2, the arms of the optical system 10A, 10B produce images 20A, 20B which are displaced to the side of the wafer W so that they can be viewed by an alignment system above the wafer W. Two possible orientations of the arms of the optical system 10A, 10B are shown in FIGS. 3 and 4, which are plan views of the wafer W, which lies in the XY plane. The wafer table WT is omitted from FIGS. 3 and 4 for clarity. In FIG. 3, the arms of the optical system 10A, 10B are aligned along the X axis. In FIG. 4, the arms of the optical system 10A, 10B are parallel to the Y axis. In both cases, the wafer marks WM1, WM2 lie on the X axis. The wafer marks WM1, WM2 are on the underside of the wafer W, so are reversed from the point of view of the top side of the wafer W. However, the arrangement of the mirrors of the arms of the optical system mean that the images 20A, 20B of the wafer marks WM1, WM2 are restored to be the correct way round again, not inverted, so that the images appear exactly the same as if they were on the top side of the wafer W. The optical system is also arranged so that the ratio of the size of a wafer mark WM1, WM2 to its image 20A, 20B is 1:1 i.e. there is no magnification or reduction. Consequently, the images 20A, 20B can be used exactly as if they were real wafer marks on the front side of the wafer W. A common alignment pattern or key provided on a mask can be used to perform alignment with both real and virtual wafer marks.

In the current example, wafer marks are provided on both the front and back sides of the wafer W at corresponding positions, as shown in FIG. 2. In FIGS. 3 and 4, only the wafer marks on the back side of the wafer W are shown, for clarity. According to this arrangement, when the wafer W is flipped over, by rotation about either of the X or Y axes, a wafer mark which was on the top side of the wafer W is now on the underside, but at a position such that it can be imaged by an arm of the optical system 10A, 10B.

It will be noted that, because of the mirror arrangement, displacement of the wafer in one direction parallel to an arm 10A, 10B of the optical system will displace the corresponding image 20A, 20B of a wafer mark WM1, WM2 on the under side of the wafer in the opposite direction. For example, in FIG. 3, if the wafer W were displaced to the right, the images 20A, 20B would be displaced to the left. Software controlling the alignment system takes this into account when determining the position of the wafer marks WM1, WM2 and when adjusting the relative positions of the wafer W and a mask when performing alignment. If the two arms of the optical system 10A, 10B are symmetric then the separation between the images 20A and 20B will in fact stay constant when the wafer is displaced.

At least two wafer marks are provided per side of the wafer W. A single mark can give information about the relative positioning of an image of a specific point on a mask to a specific point on the wafer. However, to ensure the correct orientational alignment and magnification, at least two marks are used.

Figure 5:
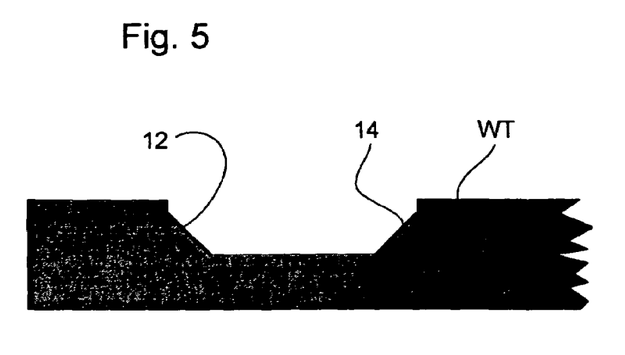
FIG. 5 is a cross section of a portion of a substrate table having integral optical components according to an embodiment of the invention.

FIG. 5 shows a portion of the wafer table WT in cross section. According to this embodiment of the invention, the optical system 10A, 10B for imaging the wafer marks on the back side of a wafer is built into the wafer table in a particular fashion. As shown in FIG. 5, the mirrors 12, 14 of an arm of the optical system are not provided as discrete components, but are integral with the wafer table WT. Appropriate faces are machined into the wafer table WT, which may then be provided with a coating to improve reflectivity, thus forming the mirrors 12, 14. The optical system is made from the same material as the wafer table, such a Zerodur™, which has a very low coefficient of thermal expansion and therefore ensures that high alignment accuracy can be maintained.

Embodiment 2

Figure 6:
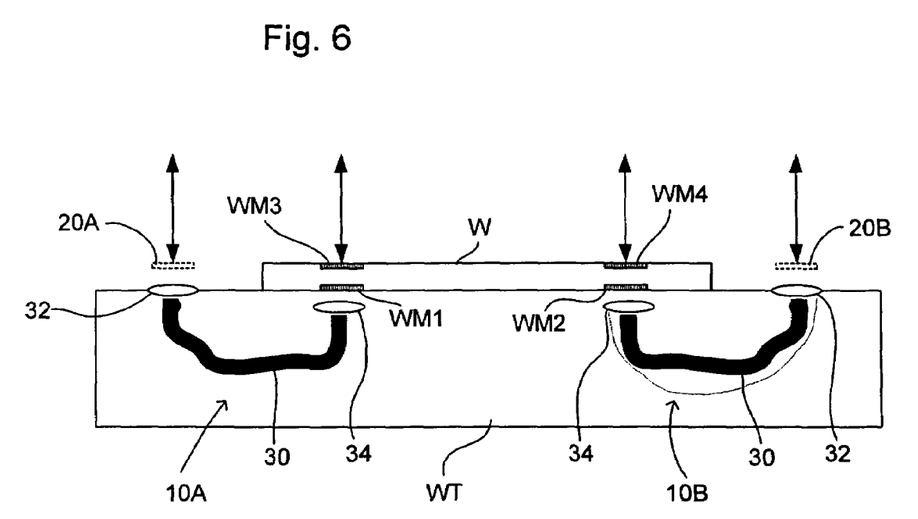
FIG. 6 is a schematic cross section of a substrate table showing the optical system for double side alignment according to a further embodiment of the invention.

FIG. 6 is a view corresponding to that of FIG. 2, but with the arms 10A, 10B of the optical system embodied using respective optical fibers 30 (or coherent optical fiber bundles) and lenses 32, 34 to couple light into and out of the fibers 30. The fibers and lenses are used to provide an image 20A, 20B of a wafer mark WM1, WM2 on the back side of the wafer W. The images 20A, 20B are located in the same plane as the wafer marks WM3, WM4 on the front side of the wafer W.

Figure 7:
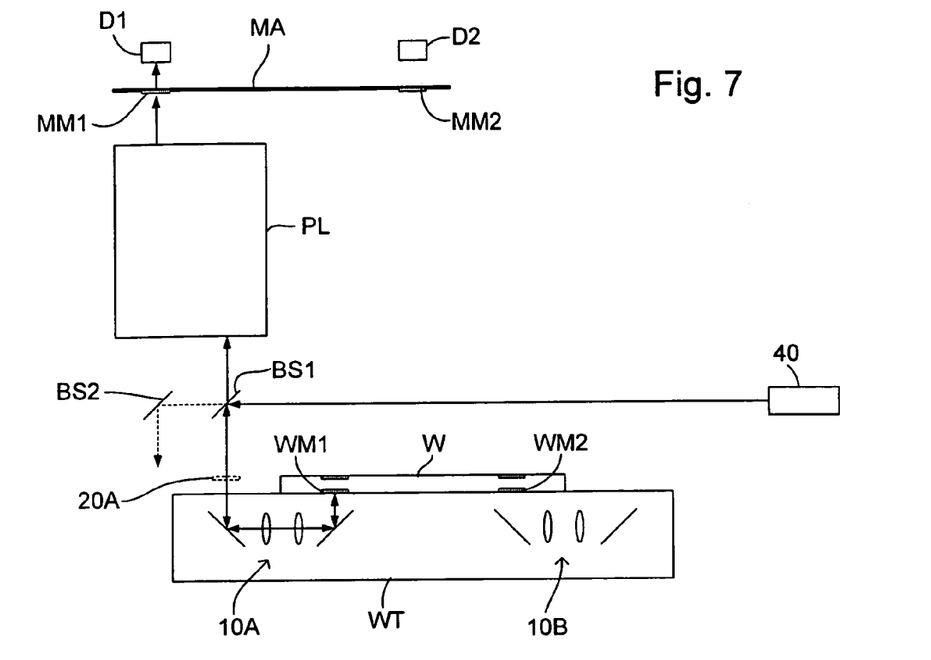
FIGS. 7 and 8 illustrate schematically the alignment optics for the alignment of two wafer marks with two mask marks.

FIGS. 7 and 8 illustrate further aspects of the alignment system. In FIG. 7, a source of radiation, such as a laser 40, e.g. a HeNe laser, directs a beam of alignment light onto a first beam splitter BS1, whereby a portion of the light is directed down through the arm 10A of the optical system in the wafer table WT, and is reflected off a first wafer mark WM1 on the back side of the wafer W, to form an image 20A of the alignment mark. Light from this image 20A passes back through the first beam splitter BS1, through a lens system PL and then through a first mask mark MM1 provided on a mask MA and onto a first detector D1. The signal produced by the detector D1 can be used to determine correct registration between the first mask mark MM1 and the image 20A. The relationship between the image 20A and the wafer mark WM1 is known from the optics 10A, and so alignment between the first mask mark MM1 and the first wafer mark WM1 can be determined. The wafer W and/or mask MA can be moved relative to one another to achieve alignment.

The alignment system of this example is a through-the-lens (TTL) arrangement, such that the lens system PL between the mask MA and the wafer W is actually the projection lens used for the exposure radiation. However, the alignment system can also be off-axis (OA).

Figure 8:
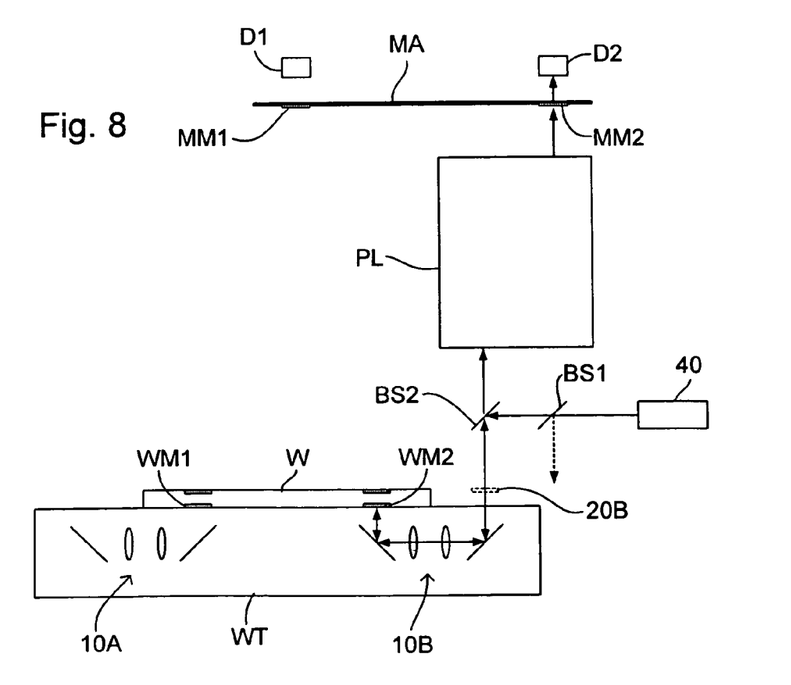

In FIG. 8, a second wafer mark WM2 is aligned with a second mask mark MM2, using a second beam splitter BS2 and the other arm 10B of the optical system. The process can be repeated to align, for example, the first mask mark MM1 with the second wafer mark WM2 and so on. Alignments can also be performed with wafer marks provided on the front (top) side of the wafer and the same or further mask marks.

An example of a double side alignment method is as follows. First wafer marks are provided on a first side of a wafer. One or more exposures are performed on that side using the first wafer marks for alignment in the usual way. Thus the position of features on the first side of the wafer relative to those first wafer marks is well established. The wafer is turned over so that the first side is now facing down and so that exposures can be performed on the second side. Using the optical system in the wafer table, the first wafer marks are imaged and are aligned relative to marks on a mask, so that the position and orientation of features on the first side (now the underside) of the wafer relative to the mask is established. Second wafer marks can then be exposed on the second side of the wafer (now on top) (or the second wafer marks could already have been provided). The relative position and orientation of the second wafer marks with respect to the first wafer marks can be determined through the mask marks and the alignment system. Exposures of features can then be done on the second side of the wafer, using the second wafer marks, and any necessary correction to ensure that they are accurately aligned with the features on the first side of the wafer. Once the relative relationship between the wafer marks on the first and second sides of the wafer is known, exposures can be performed on either side using either or both sets of marks while ensuring accurate alignment with features on the opposite side of the wafer.

If device features are to be formed on only one side of the wafer, the same apparatus can be used, but using only wafer marks on the back side of the wafer for alignment. The masks for all exposures on the front side can be aligned using the images of the back side wafer marks. It is not necessary to know the absolute relationship between the wafer marks on the back side and the features exposed on the front side, provided all masks for exposure on the front side are consistently aligned using the images of the back side wafer marks. The wafer marks on the back side will not become deteriorated because the processing is done on the front side of the wafer.

Embodiment 3

Figure 9:
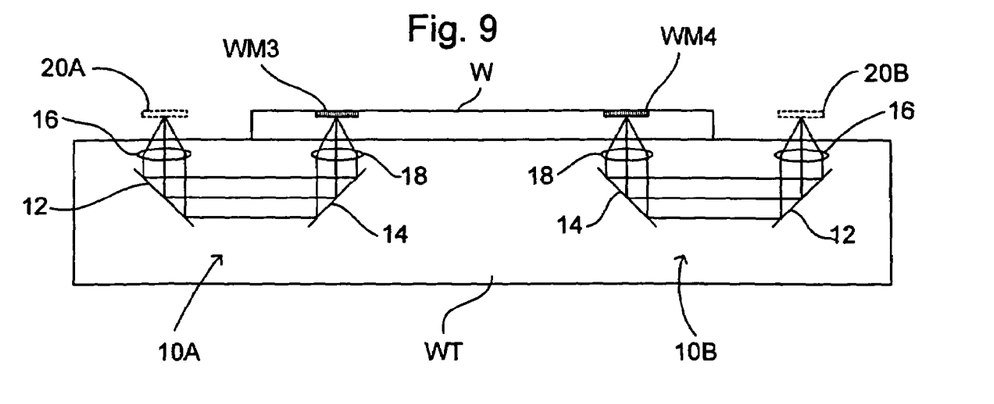
FIG. 9 is a schematic cross-section of a substrate table, wafer and optical system for alignment according to a further embodiment of the invention in which alignment radiation is transmitted through the wafer.

FIG. 9 shows an arrangement essentially the same as the embodiments in FIG. 2 and FIG. 6, except that the arms of the optical system 10A, 10B are arranged to image wafer marks WM3 and WM4, which are on the front side of the wafer W, by transmitting radiation through the wafer W via the back side of the wafer W. For example, in the case of a silicon wafer, infrared radiation is used in the alignment system because silicon is transmissive to infrared radiation.

An advantage of performing alignment imaging through the wafer, using an optical system for providing optical access from the back side of the wafer W, is that the quality of the alignment is less susceptible to deterioration caused by subsequent processing performed on the front side of the wafer, and even an opaque layer, for example of metal, could be deposited on top of the wafer marks without hindering the alignment. This embodiment could, of course, be used with further wafer marks on the back side of the wafer W, but using wafer markers on the front side means that it is not necessary to process the back side of the wafer to provide wafer marks, unless desired.

Embodiment 4

Figure 10:
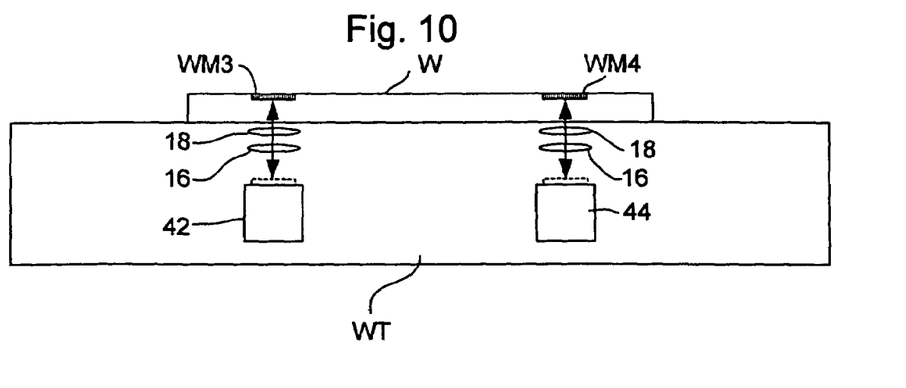
FIG. 10 is a schematic cross-section of a substrate table, wafer and optical system for alignment according to another embodiment of the invention; and In the Figures, corresponding reference symbols indicate corresponding parts.

FIG. 10 shows a further embodiment in which alignment radiation is transmitted through the wafer W via the back side of the wafer to wafer marks WM3, WM4 on the front side, and detectors 42, 44 in the wafer table WT derive the location of the wafer marks on the wafer W relative to the wafer table WT. This arrangement could equally be applied to wafer marks on the back side of the wafer using an alignment system for transmitting alignment radiation through the wafer to and from the front side.

Embodiment 5

In embodiments of the invention in which an optical system is provided such that the alignment system can have optical access to the back side of the mask, also known as back side alignment optics (BSAO), for example as shown in FIGS. 2, 6 and 9, calibration techniques are necessary. Several different ones are described below.

1. To calibrate the actual length of the BSAO, assuming the nominal length of the BSAO is known:

A set (e.g. 3) of ultra flat blank test silicon wafers are used.

Step 1: A set of marks is exposed in resist on one side of the wafers, and the marks are developed and etched on the wafers.

Step 2: Each wafer is flipped over, and a set of marks is exposed on the other side of each wafer using the BSAO for aligning the marks from step 1, using the nominal length of the BSAO as a parameter (machine constant) for the apparatus.

Step 3: Each of the wafers is flipped over once again and a set of marks is exposed on the first side with a predetermined offset, e.g. 500 nm. The overlay error between the first set of marks and this set of marks can be averaged and this value used to calculate the actual length of the back side alignment optics.

2. The optical performance of the BSAO can be calibrated in the following way, using a set (e.g. 3) of ultra flat blank test silicon wafers, and provided the actual length of the BSAO is known:

Step 1: A set of marks is exposed in resist on one side of each of the wafers, the marks are developed and etched on the wafers.

Step 2: The wafers are flipped over and a set of marks is exposed on the other side of each wafer using the BSAO for alignment to the first marks which are now on the back side of each wafer, and using the known actual length of the BSAO as a machine constant.

Step 3: The wafers are flipped over once again and a set of marks is exposed on the first side of each wafer with a certain offset, e.g. 500 nm, the overlay errors between the first set of marks and this set of marks are related to the quality of the BSAO, and the distortion of the BSAO can be calculated using known techniques.

3. A small temperature variation in the wafer table or directly in the BSAO due to environmental temperature fluctuation or substrate temperature differences can result in length of variation of the BSAO, which will have consequences for the overlay accuracy. This error can be reduced as follows:

A set of thermal probes is embedded in the BSAO and the temperature variation of the BSAO and wafer table are monitored. The length variation of the BSAO can be deduced from the temperature measurements and can be monitored in real time and can be compensated for.

4. Calibration of the BSAO with fiducial alignment marks.

The length of each arm of the BSAO (10(*a*), 10(*b*)) can be set as machine constants. The distance between any BSAO and fiducial marks on the wafer table can also be set as machine constants.

A set of fiducial alignment marks is made on each end of the BSAO. The actual lengths of the BSAO can be calibrated by aligning the reticle alignment marks to these fiducial marks.

The distance between the fiducial marks on the stage and that on either end of the BSAO can be calibrated as well. The variation of this distance can be monitored.

Such calibrations may be done on each branch of the BSAO.

Such calibrations can be done regularly, e.g. once per day, per week, per month and so on, as desired, such that that short calibration can be done and also such that the long-term drift can be monitored and compensated by updating the machine constants.

While specific embodiments of the invention have been described above, it will be appreciated that the invention may be practiced otherwise than as described. The description is not intended to limit the invention.

The invention claimed is:

1. An alignment apparatus comprising:
   a substrate table constructed and arranged to support a substrate, said substrate including a backside having at least one alignment mark thereon, at least a portion of said backside being in contact with said substrate table,
   a redirecting optical system arranged entirely in said substrate table and configured to transmit light from said at least one alignment mark to a location proximate a perimeter of said substrate; and
   a relay optical system in optical communication with said redirecting optical system and configured to relay transmitted light from the location to a detector,
   wherein said relay optical system and said redirecting optical system are located on opposite sides of said substrate.

2. An alignment apparatus according to claim 1, further comprising an alignment light source configured to illuminate said at least one alignment mark, wherein said alignment light source generates light along a light axis that is substantially perpendicular to an optical axis of said relay optical system.

3. An alignment apparatus according to claim 2, wherein said light axis and said optical axis do not intersect said substrate.

4. An alignment apparatus according to claim 2, wherein said optical axis is substantially perpendicular to a plane substantially parallel to said backside.

5. An alignment apparatus according to claim 2, wherein said light source is on a same side of the substrate as said relay optical system.

6. An alignment apparatus according to claim 2, further comprising a beam splitter arranged at the intersection between said light axis and said optical axis.

7. An alignment apparatus according to claim 1, wherein the detector is configured to receive an image of said at least one alignment mark projected by said relay optical system.

8. An alignment apparatus according to claim 1, wherein said relay optical system is mounted substantially off-axis with respect to a projection lens of a lithographic apparatus, said projection lens being configured to project a patterned beam of radiation onto a front side of said substrate that is opposite to said backside.

9. An alignment apparatus according to claim 8, wherein an optical axis of said relay optical system is substantially parallel to an optical axis of said projection lens.

10. An alignment apparatus according to claim 1, wherein said redirecting optical system has a folded optical axis having a first distal end portion and a second distal end portion, said first distal end portion being substantially parallel to said second distal end portion.

11. An alignment apparatus according to claim 10, wherein said first distal end portion and said second distal end portion are substantially perpendicular to a plane parallel to the backside of said substrate.

12. An alignment apparatus according to claim 1, wherein said redirecting optical system includes a pair of folding mirrors.

13. An alignment apparatus according to claim 1, wherein said redirecting optical system includes a first surface portion adjacent the backside of said substrate and a second surface portion that extends beyond a perimeter of said substrate.

14. An alignment apparatus according to claim 13, wherein each of said first and second surface portions is a surface of a mirror or a lens.

15. An alignment apparatus according to claim 1, wherein said redirecting optical system is arranged in a cut-out portion of said substrate table.

16. An alignment apparatus according to claim 1, further comprising a light source arranged in said substrate table and configured to illuminate said at least one alignment mark.

17. An alignment apparatus according to claim 1, wherein said substrate table is movable with respect to said relay optical system such that when said substrate table is in a first position said relay optical system is in optical communication with said redirecting optical system and when said substrate table is in another position different from said first position said projection system is not in optical communication with said redirecting optical system.

18. A lithographic projection apparatus comprising:
   a patterning structure constructed and arranged to pattern a beam of radiation;
   a projection system constructed and arranged to project said patterned beam of radiation onto a layer of photosensitive material disposed on a front side of a substrate, said substrate including a backside opposite to said front side and said backside having at least one alignment mark thereon;
   a substrate table constructed and arranged to support said substrate, at least a portion of the backside of said substrate being in contact with said substrate table,
   a redirecting optical system including at least one lens element arranged in said substrate table and configured to transmit light from said at least one alignment mark to a location proximate a perimeter of said substrate; and
   a relay optical system in optical communication with said redirecting optical system and configured to relay transmitted light from the location to a detector,
   wherein said relay optical system and said redirecting optical system are located on opposite sides of said substrate.

19. An apparatus according to claim 18, wherein the redirecting optical system further comprises at least one mirror.

20. An apparatus according to claim 18, wherein the redirecting optical system further comprises at least one optical fiber.

21. A method for aligning a substrate, said substrate being supported by a movable substrate table and including a backside having at least one alignment mark provided thereon, at least a portion of said backside being in contact with said substrate table, the method comprising:

transmitting light from said at least one alignment mark to a location proximate a perimeter of said substrate with a redirecting optical system including at least one lens element arranged in said substrate table;

projecting, with a relay optical system, a transmitted light from said at least one alignment mark at said location by said redirecting optical system; and detecting, with a detector, a projected light by said relay optical system wherein said redirecting optical system and said relay optical system are located on opposite sides of said substrate.

22. A method according to claim 21, wherein said projecting comprises coupling said relay optical system with said redirecting optical system.

23. A lithographic projection apparatus comprising:

a patterning structure which can be used to pattern a projection beam according to a desired pattern;

a movable substrate table to hold a substrate;

a projection system to project the patterned beam onto a target portion on a front side of the substrate; and an alignment system, located on a same side of the substrate as the projection system, to align a pattern of the patterning structure with an alignment mark provided on the substrate, using alignment radiation, wherein the movable substrate table comprises a redirecting optical system including at least one lens element and at least one mirror element to transmit an image of the alignment mark, for use by the alignment system, from a side of the substrate opposite the target portion.

24. An apparatus according to claim 23, wherein said redirecting optical system is arranged to transmit an image of said alignment mark at a plane of the first side of the substrate.

25. An apparatus according to claim 23, wherein said redirecting optical system is constructed and arranged to transmit a plurality of images, each image corresponding to a respective one of a plurality of alignment marks.

26. An apparatus according to claim 23, wherein said redirecting optical system comprises at least two mirrors and two lenses.

27. An apparatus according to claim 23, wherein said redirecting optical system comprises at least one optical fiber.

28. An apparatus according to claim 23, wherein said redirecting optical system is arranged to provide the image at a location displaced laterally from the corresponding alignment mark and beyond the periphery of the area to be occupied by the substrate.

29. An apparatus according to claim 23, wherein said alignment mark is on a backside of the substrate opposite said front side.

30. An apparatus according to claim 23, wherein said alignment system is adapted to perform alignment using a reference mark provided on the front side of the substrate in addition to using said alignment mark image provided by said redirecting optical system.

31. An apparatus according to claim 23, wherein said alignment mark is on the front side of the substrate, said alignment radiation is substantially transmissible through the substrate, and said alignment radiation is transmitted through the substrate during alignment of the patterning structure with the alignment mark.

32. An apparatus according to claim 31, wherein the alignment radiation comprises infra-red radiation.

33. An apparatus according to claim 23, wherein the alignment radiation and the projection beam have substantially the same wavelength.

34. A substrate table comprising:

a body constructed and arranged to support a substrate, said substrate including at least one alignment mark provided thereon; and a redirecting optical system arranged in said body and including at least one lens element and being configured to transmit light from said at least one alignment mark to a location proximate a perimeter of said substrate, wherein said redirecting optical system has a folded optical axis having a first end portion and a second end portion, said first and second end portions being substantially parallel to each other and arranged to transmit light in opposite directions.

35. A substrate table according to claim 34, wherein said redirecting optical system redirect is in optical communication with a relay optical system that is configured to relay the transmitted light from said location to a detector.

36. A substrate table according to claim 35, wherein said redirecting optical system and said relay optical system are located on opposite sides of said substrate.

37. A substrate table according to claim 35, wherein said substrate table is movable with respect to said relay optical system such that when said substrate table is in a first position said relay optical system is in optical communication with said redirecting optical system and when said substrate table is in another position different from said first position said projection system is not in optical communication with said redirecting optical system.

38. A substrate table according to claim 34, wherein said redirecting optical system includes a pair of folding mirrors.

39. A substrate table according to claim 34, wherein said redirecting optical system includes a first surface portion adjacent a backside of said substrate and a second surface portion that extends beyond a perimeter of said substrate.

40. A substrate table according to claim 39, wherein each of said first and second surface portions is a surface of a mirror or a lens.

41. A substrate table according to claim 39, wherein said redirecting optical system is arranged in a cut-out portion of said body.

42. A substrate table according to claim 34, further comprising a light source arranged in said body and configured to illuminate said at least one alignment mark.

* * * * *